US010813234B2

United States Patent
Herzig et al.

(10) Patent No.: US 10,813,234 B2
(45) Date of Patent: Oct. 20, 2020

(54) DISTRIBUTED ENERGY GENERATION AND CONSUMPTION MONITORING AND REPORTING DEVICE WITH MODULAR COMMUNICATION UPGRADABILITY AND PROTECTION DOMAINS IN HARDWARE

(71) Applicant: Locus Energy, Inc., Hoboken, NJ (US)

(72) Inventors: Michael Herzig, Leonia, NJ (US); Anil Ramachandran, Santa Clara, CA (US); Gabriel Abbott, San Francisco, CA (US)

(73) Assignee: LOCUS ENERGY, INC., Hoboken, NJ (US)

( * ) Notice: Subject to any disclaimer, the term of this patent is extended or adjusted under 35 U.S.C. 154(b) by 444 days.

(21) Appl. No.: 15/819,224

(22) Filed: Nov. 21, 2017

(65) Prior Publication Data

US 2019/0159353 A1    May 23, 2019

(51) Int. Cl.
*G01R 22/06* (2006.01)
*H02S 50/00* (2014.01)
*H05K 5/02* (2006.01)
*H05K 5/03* (2006.01)

(52) U.S. Cl.
CPC ........ *H05K 5/0208* (2013.01); *G01R 22/063* (2013.01); *G01R 22/065* (2013.01); *H02S 50/00* (2013.01); *H05K 5/0247* (2013.01); *H05K 5/0269* (2013.01); *H05K 5/03* (2013.01)

(58) Field of Classification Search
None
See application file for complete search history.

(56) References Cited

U.S. PATENT DOCUMENTS

| 6,059,605 A | 5/2000 | Robinson et al. |
| 6,420,801 B1 | 7/2002 | Seefeldt |
| 2003/0080622 A1 | 5/2003 | Koenig |
| 2009/0124119 A1 | 5/2009 | Austin |
| 2010/0003848 A1 | 1/2010 | Scott et al. |
| 2010/0071744 A1 | 3/2010 | Peurach et al. |
| 2010/0218798 A1 | 9/2010 | Cinnamon et al. |

(Continued)

OTHER PUBLICATIONS

U.S. Appl. No. 15/401,248, filed Jan. 9, 2017, published as U.S. Pub. No. 2017/0215295.

(Continued)

*Primary Examiner* — Roy Y Yi
(74) *Attorney, Agent, or Firm* — Sheridan Ross P.C.

(57) ABSTRACT

An electrical unit with modular hardware structure in which more complex and unsafe portions of the device are restricted for access by a qualified electrician only, whereas safe areas are made accessible to a non-electrician user, such as a homeowner or a low expertise technician, to help diagnose issues and/or upgrade the functionality of the device without requiring the presence of a high expertise technician/electrician. The restricted portion includes a main Printed Circuit Board (PCB) that is selectively populated with certain circuit components and that contains electrical connections to enable the electrical unit to be operated in a number of different operating configurations depending on which components are populating the main PCB. A smaller, interconnect PCB also may be provided in the restricted portion and hardware-paired with the main PCB to facilitate wiring of the main PCB via the interconnect PCB and add further modularity to the electrical interconnect scheme.

20 Claims, 6 Drawing Sheets

(56) References Cited

U.S. PATENT DOCUMENTS

| | | |
|---|---|---|
| 2012/0104848 A1 | 5/2012 | Lathrop et al. |
| 2014/0127935 A1 | 5/2014 | Scott et al. |
| 2015/0051749 A1 | 2/2015 | Hancock et al. |
| 2015/0338446 A1 | 11/2015 | Zhu et al. |
| 2017/0214225 A1 | 7/2017 | Ramachandran et al. |
| 2017/0215295 A1 | 7/2017 | Herzig et al. |

OTHER PUBLICATIONS

U.S. Appl. No. 15/404,281, filed Jan. 12, 2017, published as U.S. Pub. No. 2017/0214225.

"Monitoring & Reporting Applications Guide," EnergyTrust of Oregon, Aug. 2011, 50 pages.

Official Action for U.S. Appl. No. 15/401,248, dated Nov. 14, 2018, 9 pages.

Notice of Allowance for U.S. Appl. No. 15/401,248, dated Mar. 26, 2019, 11 pages.

Official Action for U.S. Appl. No. 15/404,281, dated May 2, 2019, 19 pages.

DISTRIBUTED ENERGY GENERATION AND CONSUMPTION MONITORING AND REPORTING DEVICE WITH MODULAR COMMUNICATION UPGRADABILITY AND PROTECTION DOMAINS IN HARDWARE

CROSS-REFERENCE TO RELATED APPLICATIONS

This application is related to U.S. patent application Ser. No. 15/401,248 filed on Jan. 9, 2017, and to U.S. Provisional Application No. 62/436,075 filed on Dec. 19, 2016, the disclosure of each of which is incorporated herein by reference in its entirety.

TECHNICAL FIELD

The present disclosure generally relates to energy monitoring and reporting devices. More particularly, and not by way of limitation, particular embodiments of the present disclosure are directed to an electrical unit for monitoring and reporting of energy generation and consumption, and having a modular hardware structure in which more complex and unsafe portions of the device are restricted for access by a qualified electrician only, whereas safe areas are made accessible to a homeowner or low expertise technician to help diagnose issues and/or upgrade the functionality of the device without requiring the presence of a high expertise technician/electrician.

BACKGROUND

A photovoltaic (PV) system converts the sun's radiation into usable electricity. PV systems range from small, rooftop-mounted or building-integrated systems with capacities from a few to several tens of kilowatts, to large, utility-scale power stations of hundreds of megawatts. Some PV systems may be connected to an electrical grid to enable transmission and distribution of their generated-electricity to other participants in the utility market. On the other hand, some PV systems, such as, for example, residential or small-scale PV systems, may be off-grid or stand-alone systems. A PV system may comprise a solar/PV array to convert solar radiation into Direct Current (DC) electricity, a charge controller to receive the generated DC electrical current and transfer it for storage, a storage (battery) unit to store a portion of the generated electricity, and an inverter to convert the stored electric current from DC to AC (Alternating Current) to drive an AC load.

A PV solar system or any other renewable energy system may employ monitoring equipment to monitor and report the generation and consumption of renewable energy. The monitoring equipment may communicate with a remote management equipment (for example, a database server) for remote storage and analysis of data collected by the monitoring equipment. The remote management equipment may communicate with the monitoring equipment via a network-like a cellular network, the internet, a combination of wireline and wireless networks, and the like. Such data storage and analysis may be used to generate billing, assess system operations, generate system performance analytics, perform remote troubleshooting and alert a qualified technician to visit the site for additional troubleshooting and maintenance, and so on.

SUMMARY

One of the challenges in installing monitoring equipment with communication capability is that the equipment must serve the long time span (for example, 20 years) of PV solar, energy storage and/or other distributed energy management equipment despite ongoing changes in both communication protocols as well as the distributed energy technology itself. In a span of 20 years, cellular, radio, satellite, and home networking communication technologies may change drastically and make old communication technologies either obsolete and completely non-functional, or barely working but a drag on newer technologies and protocols. In addition, during this time period, there may be rapid developments in home energy management, energy storage and improved solar PV.

For example, the original 802.11 Wi-Fi (Wireless Fidelity) communication standard was introduced in 1997, and the 802.11b standard was introduced in 1999. Products from those years, if forced to serve the market until 2017 or 2019, would barely work with newer Wi-Fi standards, and if they work, would significantly reduce air throughput of Wi-Fi in the home where PV solar instruments are installed. Similarly, cellular operators are repurposing the 2G (Second Generation) spectrum to use on 4G (Fourth Generation). Allowing 2G devices to continue to operate on a 4G network would incur major spectral efficiency costs, as well as hold back progress towards newer, faster, and better communication methods.

One possible option of mitigating the above problem is to provision for the monitoring device to be replaced within the lifespan of the renewable energy system—such as, for example, a PV solar system. However, performing this replacement can be both expensive and complex because a monitoring equipment can involve high voltage electrical connections, as well as communication interface connections to various system units such as, for example, inverters, batteries, charge controllers, weather stations, and the like. This would mean that a qualified electrician or a high expertise technician has to be involved in such a replacement. This can result in very high costs, usually more than twice the cost of the original monitoring hardware.

With most monitoring equipment, another associated problem is the difficulty in enlisting the help of the homeowner or a low expertise technician in remotely diagnosing the unit. Because the monitoring equipment has high voltage wiring, there are material risks in having the homeowner or a low expertise technician try to perform service or diagnostic activities on their own.

Another issue with installing a monitoring and reporting equipment in a home is the tradeoff between using home networking (such as a home Wi-Fi network) versus a cellular/external network as the backhaul to communicate with the remote management equipment. While a cellular network integration provides a reliable backhaul independent of the home network, it increases the hardware cost and adds a recurring expenditure. The home network, while cheap, can be unreliable, and the short installation timeframe does not provide enough information on the long term reliability of the home network to decide whether the home network is good enough for the backhaul. The high cost of a future truck roll to the home with a high expertise technician however means that the install company has to decide one way or the other at the time of installation of the monitoring equipment.

Existing technology includes physically splitting the monitoring device into two separate pieces—one piece performs as the monitoring element, and the other piece performs as the communicating element. For example, in such a configuration, a monitoring device could have a separate communicating element—like a 900 MHz RF (Radio Frequency) radio or a Homeplug interface to a gateway—which could be located within the house and accessible to the homeowner for replacement. However, such an implementation (a) includes high cost and (b) adds one more wireless communication mode to the product, which can result in more problems that need to be troubleshot. For example, instead of just one wireless communication mode—that is, communication between the monitoring device and the remote management equipment, the split-device implementation mentioned here creates two separate wireless communication modes—one between the monitoring element and the physically separately located communicating element, and the other between the communicating element and the remote management equipment. Additional communication modes indeed create additional problems that need to be diagnosed and rectified.

It is therefore desirable to provide a monitoring device that does not create additional communication modes between its constituent parts and that has a portion accessible to a non-electrician user (such as a homeowner or a low expertise technician) to perform certain upgrades and troubleshooting of the device without requiring the presence of a qualified electrician.

As a solution, particular embodiments of the present disclosure provide an electrical unit for monitoring and reporting of energy generation and consumption. The electrical unit has a modular hardware structure in which more complex and unsafe portions of the device are restricted for access by a qualified electrician only, whereas safe areas are made accessible to a homeowner or low expertise technician to help diagnose issues and/or upgrade the functionality of the device without requiring the presence of a high expertise technician/electrician.

More specifically, the electrical unit as per teachings of the present disclosure may have two features—modular upgradeability, and separate access levels (or protection domains). As part of modular upgradeability, the unit may include the ability to add new communication interfaces in a modular manner. Thus, instead of replacing the entire monitoring unit, new communication interfaces can simply be added or replaced, preferably by a non-electrician user. Software in support for the new communication interface may be (a) applied over the air if the unit is still communicating using the old interface, (b) applied using a local interface prior to adding the new hardware, (c) contained as part of the new hardware and absorbed by the main device when the new hardware is added. Alternatively, the new/upgraded interface may be designed to be plug-and-play ready so that no new software is required to support the new interface being added. Protection domains are created by designing the electrical unit to include an outer, easier level of physical access, open to the homeowner or a low expertise technician. This area would support the modular upgrade interfaces for communication as well as diagnostic interfaces for debugging issues. An inner, more tightly restricted area of access may be used to shield the high voltage wiring as well as wired industrial communication interfaces—such as the standardized RS485 ports based on the TIA/EIA (Telecommunications Industry Association/Electronic Industries Alliance) 485 standard—to the inverters, batteries, charge controllers, weather stations, and the like, from the homeowner.

In addition to the modularity in the communication options, the electrical unit also may provide modularity to the electrical interconnect scheme in the secure or protected portion (which is not accessible by a non-electrician user) by having a main Printed Circuit Board (PCB) in the secure portion that is selectively populated with certain circuit components and that contains electrical connections to enable the electrical unit to be operated in a number of different operating configurations depending on which components are populating the main PCB. A smaller, interconnect PCB also may be provided in the protected portion and may be hardware-paired with the main PCB to facilitate wiring of the main PCB via the interconnect PCB and add further modularity to the electrical interconnect scheme, as discussed in more detail later below.

In one embodiment, the present disclosure is directed to an electrical unit that comprises an interface module and an operative module. The interface module is physically attached to the operative module and electrically connected thereto to form a unitary structure for the electrical unit. The interface module includes at least one of the following: (i) a communication interface to enable the operative module to remotely communicate with a control unit external to the electrical unit, and (ii) a diagnostic interface to indicate operational status of the electrical unit and to enable remote diagnosis of the electrical unit. In the electrical unit, the interface module is accessible to a non-electrician user to perform upgrade of the interface module and troubleshooting for the electrical unit without requiring presence of a qualified electrician. On the other hand, the operative module has circuit components accessible to a qualified electrician only, wherein the operative module includes a main Printed Circuit Board (PCB) selectively populated with a portion of the circuit components and having electrical connections that enable the electrical unit to be operated in at least one of a plurality of configurations depending on which components are in the portion of the circuit components populating the main PCB.

In particular embodiments, some or all of the following circuit components may be selected to populate the main PCB: one or more energy-metering chips, a three-phase voltage connector, one or more current transformers, one or more memory units, an RS-485 port, an Ethernet port, one or more Universal Serial Bus (USB) ports, hardware and software to support wireless cellular communication, an electrical relay unit, a Wireless Fidelity (Wi-Fi) port, and the like.

In one embodiment, the operative module and the interface module are covered in a nested configuration in which an inner cover shields the operative module to prevent the non-electrician user from accessing the operative module and a removable outer cover is placed over the inner cover to allow the non-electrician user to access the interface module.

In another embodiment, the operative module and the interface module are covered in a non-overlapping configuration in which a first cover shields the operative module to prevent the non-electrician user from accessing the operative module and a removable second cover is placed adjacent to the first cover and over the interface module to allow the non-electrician user to access the interface module.

In the interface module, the communication interface may be at least one of the following: a cellular telecommunications interface, a Wi-Fi interface, a Radio Frequency (RF) interface, and an Ethernet interface.

In the interface module, the diagnostic interface may be at least one of the following: a USB interface, an Ethernet interface, a mini-Peripheral Component Interconnect express (mini-PCIe) interface, a Personal Computer Memory Card International Association (PCMCIA) interface, a Universal Smart Network Access Port (USNAP) interface, and a DB9 port.

Some examples of the electrical unit as per teachings of the present disclosure include a renewable energy monitoring unit, an electrical switch, a circuit load panel, an energy storage meter, and an electrical energy monitoring unit.

In one embodiment, the present disclosure is directed to a method that comprises: (a) providing an electrical unit that comprises an operative module and an interface module as outlined above; and (b) remotely instructing the non-electrician user to perform upgrade of the interface module and troubleshooting for the electrical unit using the interface module.

In another embodiment, the present disclosure is directed to an electrical unit that comprises: (i) an operative module having circuit components accessible to a qualified electrician only; and (ii) an interface module physically attachable to the operative module and electrically connectible thereto, wherein, upon attachment, the operative module and the interface module form a unitary structure for the electrical unit. The operative module includes a main PCB selectively populated with a portion of the circuit components and having electrical connections that enable the electrical unit to be operated in at least one of a plurality of configurations depending on which components are in the portion of the circuit components populating the main PCB. The interface module includes at least one of the following: (a) a communication interface to enable the operative module to remotely communicate with a control unit external to the electrical unit, and (b) a diagnostic interface to indicate operational status of the electrical unit and to enable remote diagnosis of the electrical unit. The interface module is accessible to a non-electrician user to perform upgrade of the interface module and troubleshooting for the electrical unit without requiring presence of a qualified electrician.

Thus, the separation of unsafe and safe portions of an energy monitoring unit and controlled accessibility to these portions as per teachings of the present disclosure results in reduced costs for upgrading and troubleshooting of the unit because a homeowner or a low-skilled technician can perform such routine upgrading or troubleshooting without the need to wait for a visit by a qualified (and more expensive) electrician to the site. The communication interface in the monitoring unit may be upgraded at low cost by the homeowner or a non-electrician to make the unit hardware compatible with cellular network sunset or home network protocol obsolescence. Similarly, by providing the homeowner with access to debug interfaces and diagnostic indicators, troubleshooting costs for the monitoring unit are reduced and outcomes are improved. Remote troubleshooting may be more effective, leading to fewer truck rolls (with costly electrician visits to the sites), lower costs, faster resolution, and higher customer satisfaction. Multiple device configurations may be supported depending on what components are populated within the main PCB in the controlled portion (the operative module) of the device.

BRIEF DESCRIPTION OF THE DRAWINGS

In the following section, the present disclosure will be described with reference to exemplary embodiments illustrated in the figures, in which.

DETAILED DESCRIPTION

In the following detailed description, numerous specific details are set forth in order to provide a thorough understanding of the disclosure. However, it will be understood by those skilled in the art that the present disclosure may be practiced without these specific details. In other instances, well-known methods, procedures, components and circuits have not been described in detail so as not to obscure the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" or "according to one embodiment" (or other phrases having similar import) in various places throughout this specification are not necessarily all referring to the same embodiment. Furthermore, the particular features, structures, or characteristics may be combined in any suitable manner in one or more embodiments. Also, depending on the context of discussion herein, a singular term may include its plural forms and a plural term may include its singular form. Similarly, a hyphenated term (e.g., "transformer-rated," "Wi-Fi", "on-site," etc.) may be occasionally interchangeably used with its non-hyphenated version (e.g., "transformer rated," "WiFi", "on site," etc.), and a capitalized entry (e.g., "Electrical Unit," "Operative Module," "Electrician Zone," etc.) may be interchangeably used with its non-capitalized version (e.g., "electrical unit", "operative module," "electrician zone," etc.). Such occasional interchangeable uses shall not be considered inconsistent with each other.

It is noted at the outset that the terms "coupled," "operatively coupled," "connected", "connecting," "electrically connected," etc., are used interchangeably herein to generally refer to the condition of being electrically/electronically connected in an operative manner. Similarly, a first entity is considered to be in "communication" with a second entity (or entities) when the first entity electrically sends and/or receives (whether through wireline or wireless means) information signals (whether containing address, data, or control information) to/from the second entity regardless of the type (analog or digital) of those signals. It is further noted that various figures (including component diagrams) shown and discussed herein are for illustrative purpose only, and are not drawn to scale.

The terms "first," "second," etc., as used herein, are used as labels for nouns that they precede, and do not imply any type of ordering (e.g., spatial, temporal, logical, etc.) unless explicitly defined as such.

Figure 1:
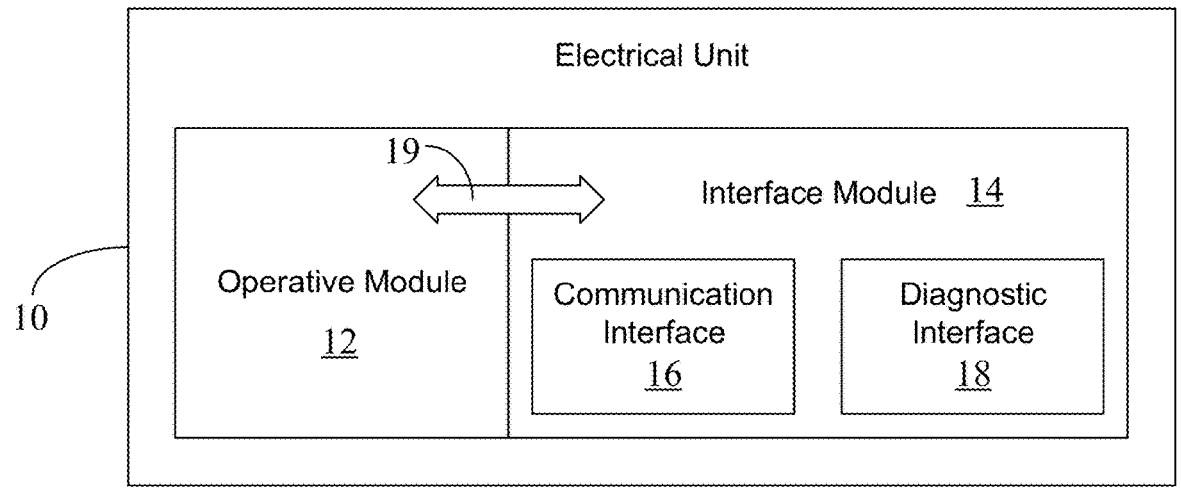
FIG. 1 is a simplified block diagram of an exemplary electrical unit as per teachings of one embodiment of the present disclosure.

FIG. 1 is a simplified block diagram of an exemplary electrical unit 10 as per teachings of one embodiment of the present disclosure. Although a renewable energy monitoring unit is used as a primary example of the electrical unit 10 in the discussion below, it is noted that the discussion equally applies to other types of electrical units such as, for example, an electrical switch, a circuit load panel, an energy storage meter, an electrical energy monitoring unit, an electrical vehicle charging unit, a utility meter, and the like. As shown, the electrical unit 10 may include an operative module 12 and an interface module 14. The operative module 12 may have circuit components accessible to a qualified electrician only. The interface module 14, on the other hand, may include a communication interface 16 and a diagnostic interface 18, and may be accessible to a non-electrician user—such as a homeowner or a low-skilled or low expertise technician—to allow the non-electrician user to perform upgrade of the interface module and troubleshooting for the electrical unit without requiring presence of a qualified electrician. As discussed later, such bifurcated or divided access allows a non-electrician user to perform routine upgrades and troubleshooting without requiring costly trips to the site by a qualified electrician.

In particular embodiments, the interface module 14 may be physically attached to the operative module 12 and electrically connected to the operative module 12 to form a unitary structure for the electrical unit 10. The physical attachment and electrical connection (or operational coupling) between the operative module 12 and the interface module 14 is illustrated by the bi-directional arrow 19 in FIG. 1. The communication interface 16 may enable the operative module 12 to remotely communicate with a control unit (not shown) external to the electrical unit 10. The control unit may be, for example, a remote server, a customer service center, or the earlier-mentioned management equipment associated with a renewable energy site to facilitate billing, remote troubleshooting, performance analytics, and the like. The diagnostic interface 18 may indicate operational status of the electrical unit 10 and may enable remote diagnosis of the electrical unit 10.

It is noted here that, in certain embodiments, the interface module 14 may not contain both of the interfaces 16, 18. For example, in one embodiment, the on-board diagnostics features may not be available and, hence, the diagnostic interface 18 may be absent or may have significantly limited functionality. In another example, the electrical unit 10 may not need to communicate with a remote management equipment. In that case, the communication interface 16 may be absent or may have limited functionality. Alternatively, in other embodiments, the functionalities of the individual interfaces 16, 18 may be combined into a single interface forming the interface module 14.

In particular embodiments, initially the operative module 12 and the interface module 14 may be separate. However, to make the electrical unit 10 operational, the interface module 14 may be physically attachable to and electrically connectible to the operative module 12. Upon attachment, the operative module 12 and the interface module 14 may form a unitary structure for the electrical unit 10.

As noted before, upon installation and during operation, the operative module 12 and the interface module 14 form a unitary (that is, integrated or undivided) structure for the electrical unit 10. As a result, during operation, these modules do not split the electrical unit 10 into two physically separate pieces. Thus, unlike the existing monitoring devices, the electrical unit 10 does not require to establish and maintain an additional communication mode between the operative module 12 and the interface module 14. Rather, the electrical unit 10 is operatively configured as a single and structurally-integrated entity communicating with the remote management equipment (not shown).

FIGS. 2 through 5 show different implementations for the electrical unit 10 in FIG. 1. Hence, different reference numerals are used for each implementation and its constituent parts to distinguish them from one another. It is understood, however, that each implementation in FIGS. 2-5 is a specific example of the generic electrical unit 10 shown in the embodiment of FIG. 1.

Figure 2:
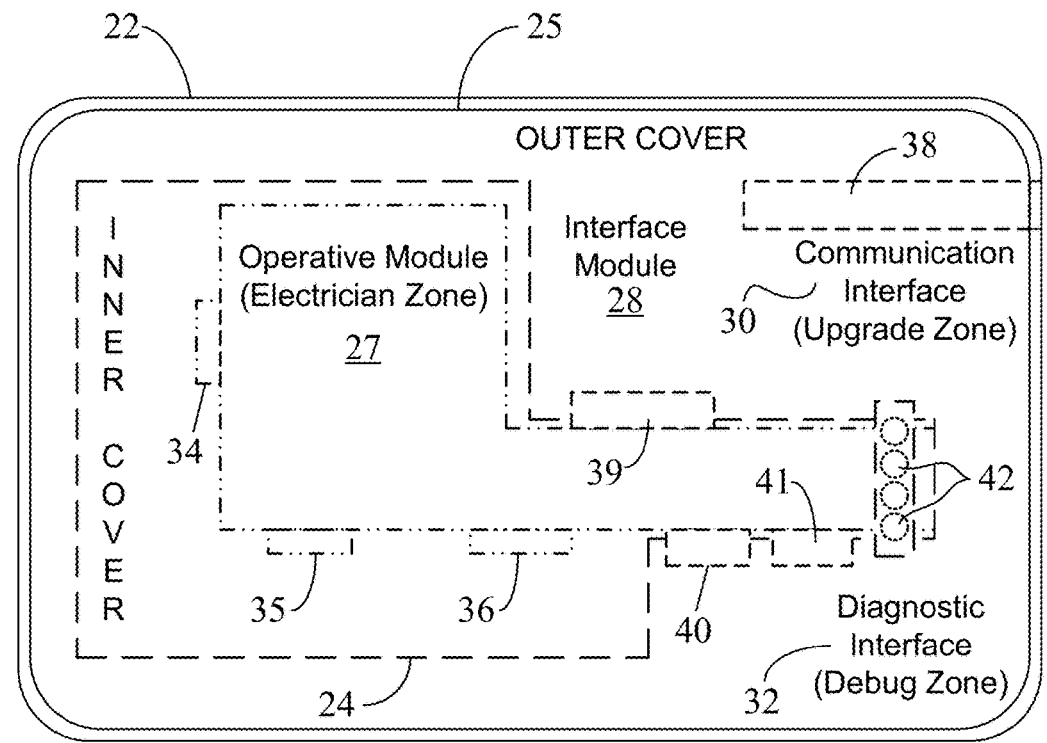
FIG. 2 shows an exemplary electrical unit implementing the divided access aspect discussed with reference to the electrical unit in the embodiment of FIG. 1 using a nested configuration.

FIG. 2 shows an exemplary electrical unit 20 implementing the divided access aspect discussed with reference to the electrical unit 10 in the embodiment of FIG. 1 using a nested configuration. In this implementation, a plastic base 22 mates with two covers—an inner cover 24 and an outer cover 25. In one embodiment, the inner and outer covers 24-25 may be of plastic as well. The inner cover 24 shields an operative module (or electrician zone) 27 that a homeowner or a low expertise technician is prevented from accessing. The outer cover 25, however, is more easily removable and is placed over the inner cover 24. Upon removal, the outer cover 25 allows a non-electrician user to access an interface module 28 of the electrical unit 20. In the embodiment of FIG. 2, the interface module 28 is shown to have two constituent interfaces—a communication interface (or upgrade zone) 30 and a diagnostic interface (or debug zone) 32. The removable outer cover 25 allows access to upgrade and debug zones 30, 32 within the device 20 because these zones are safe to be accessed by a homeowner or a low expertise technician.

The arrangement of inner and outer covers 24-25 in the embodiment of FIG. 2 creates a nested configuration in which the smaller inner cover 24 is nested inside the larger outer cover 25. The operative module 27 and its associated inputs and ports (identified below) are distinguished from other parts and components in the electrical unit 20 by using the line pattern "-..-..-" as opposed to the simple dashed line patterns "— — —" (for the inner cover 24) and "- - - -" (for the parts of the interface module 28).

In the embodiment of FIG. 2, the operative module 27 may include: (i) one or more voltage inputs 34 such as, for example, L1 (Line 1), L2 (Line 2), N (Negative), and G (Ground) inputs, or Voltage Transformer (VT) inputs; (ii) one or more Current Transformer (CT) inputs 35 or other current inputs for PV energy generation and consumption monitoring; (iii) one or more RS485 ports 36; and (iv) the electronic Printed Circuit Board (PCB) (not shown) for the operative module itself. These inputs and ports 34-36 and the electronic circuit board are included in the electrician zone and shielded from the homeowner. Additional details of an exemplary PCB containing such components for an operative module are provided later below with reference to discussion of FIG. 8.

The upgrade zone 30 in the interface module 28 may include: (i) a "shelf" 38 to place a cellular dongle or modem, and (ii) one or more USB slots 39 for modules that the homeowner may add for upgraded connectivity options. On the other hand, the debug zone 32 may include one or more USB interfaces 40 and one or more Ethernet interfaces 41 to allow the homeowner to debug issues on his/her own or through a remote troubleshooting session with a service person. In one embodiment, Light Emitting Diodes (LEDs) 42 also may be provided as part of the debug zone 32 to visually indicate status of various monitoring operations being carried out by the operative module 27. The visibility to these LEDs 42 may be made available either through the outer cover 25 or upon removal of the outer cover 25.

It is noted here that the implementation shown in FIG. 2 is only an example. What interfaces are made available for upgradability and what interfaces get covered up by a shield in the higher access level zone may differ in other implementations. The actual mechanism for providing these separate access level tiers also may be different in other embodiments. For example, the divided access mechanism in the embodiment of FIG. 2 uses nested access zones, whereas that in the embodiment of FIG. 3 uses side-by-side access zones as discussed below.

Figure 3:
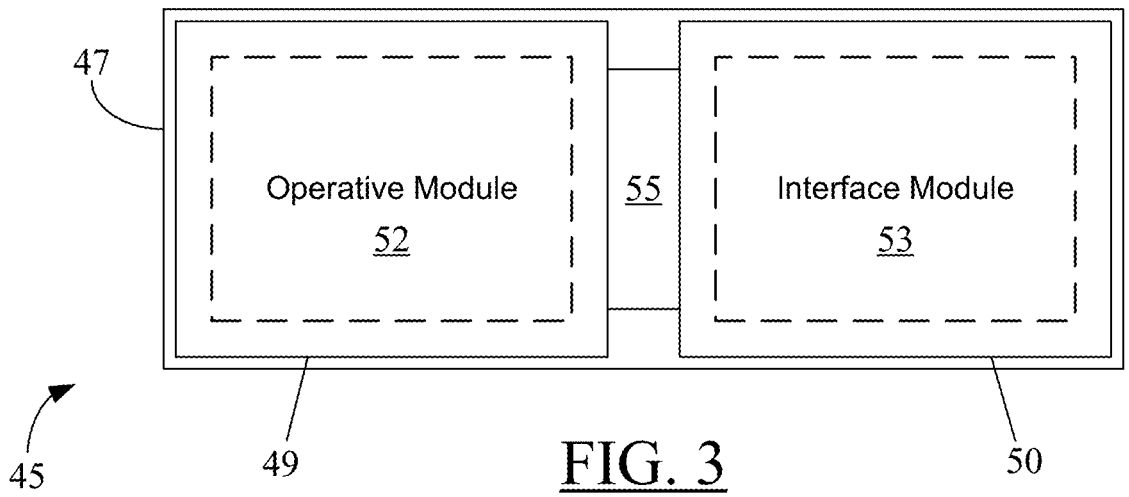
FIG. 3 shows an exemplary electrical unit implementing the divided access aspect discussed with reference to the electrical unit in the embodiment of FIG. 1 using side-by-side access zones.

FIG. 3 shows an exemplary electrical unit 45 implementing the divided access aspect discussed with reference to the electrical unit 10 in the embodiment of FIG. 1 using side-by-side access zones. In the embodiment of FIG. 3, a plastic base 47 mates with two covers 49-50 placed side-by-side in a non-overlapping configuration. The covers 49-50 may be made of plastic as well. One cover 49 shields an operative module 52 to prevent a non-electrician user from accessing the module 52. The other cover 50 is placed adjacent to the operative module's cover 49 and over an interface module 53. The interface module's cover 50 may be removable by a non-electrician user to access the module 53. For ease of illustration, additional component details for the modules 52-53 in FIG. 3 are not shown. However, it is understood that, in one embodiment, the modules 52-53 may have circuit components—like USB and Ethernet interfaces, voltage inputs, and so on—similar to or different from those shown with reference to corresponding operative and interface modules in the embodiment of FIG. 2. A connecting portion 55 in FIG. 3 illustrates physical attachment and electrical connection between the two modules 52-53.

In addition to the structures in the embodiments of FIGS. 2-3 having two-layer enclosures, other alternative structures that provide a homeowner or a low-skilled technician the ability to access diagnostic/communication interfaces without access to the high voltage electrical portion and high expertise areas also may be possible as discussed below with reference to the exemplary embodiments in FIGS. 4-5.

Figure 4:
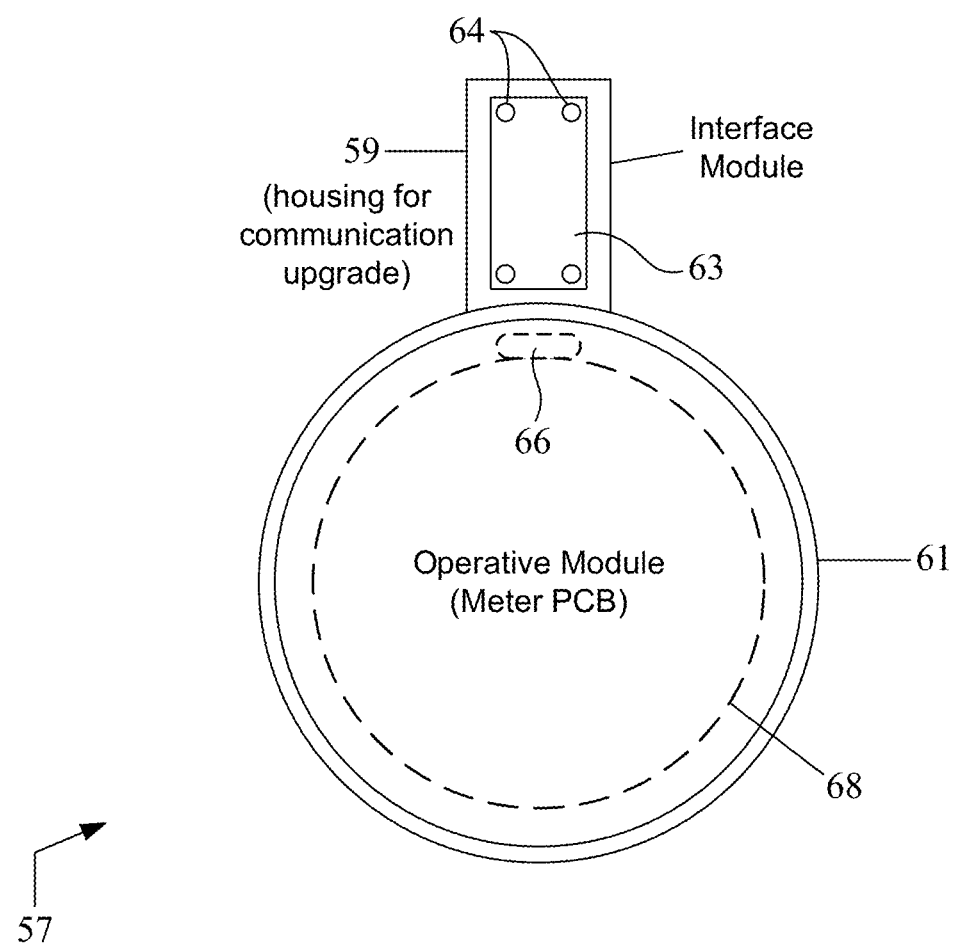
FIG. 4 depicts another exemplary electrical unit implementing the divided access aspect discussed with reference to the electrical unit in the embodiment of FIG. 1 using a protruding attachment.

FIG. 4 depicts another exemplary electrical unit 57 implementing the divided access aspect discussed with reference to the electrical unit in the embodiment of FIG. 1 using a protruding attachment 59. In one embodiment, the protruding attachment 59 may be the interface module of the electrical unit 57. The operative module of the electrical unit 57 may be a utility meter or a socket meter 61 that may have a protruding compartment 59 attached thereto. The protruding attachment 59 may have at least one removable side such as, for example, a hermetically sealed door 63 that may be secured with one or more screws 64 that could be opened by a low expertise level technician to perform a diagnostic activity, a firmware upgrade, add communication functionality, or upgrade existing communication functionality. In the embodiment of FIG. 4, the socket meter 61 is shown with a USB port 66 on the edge of the socket meter's envelope. The door 63 may provide access to the housing for communication upgrade and the USB port 66. The protrusion 59 may be attachable to the meter 61 in the field or the entire unit 57 may be manufactured with the protrusion 59 already attached to the meter 61. For example, in one embodiment, the protrusion 59 may be added into the plastic enclosure (not shown) of the meter 61 and/or an acrylic dome (not shown) of the meter 61 on the face/side of the meter directly facing the USB port 66. In certain embodiments, the protrusion may be rectangular or cylindrical in shape depending on the geometry of the operative module (or socket meter) and available attachment options. As shown in FIG. 4, the protrusion 59 may have one or more face (or side) removable by using screw(s). For example, a protrusion—like the protrusion 59—may be cylindrical and it may have an outer circle that could be a removable disc. The low cost technician/homeowner would be able to unscrew this disc and insert a communication upgrade interface or a diagnostic interface into a USB port—like the USB port 66. The embodiment in FIG. 4 depicts a view of the socket meter 61 from its face, with the electronic circuit board or PCB 68 of the operative module shown as a dashed circle. While the embodiment in FIG. 4 shows the application of a protrusion-based design to a socket meter, it is understood that the teachings of the present disclosure cover the usage of such a protruding compartment with an openable door/window to allow the addition or upgrade of a debug/communication interface to a transformer-rated meter as well.

Figure 5:
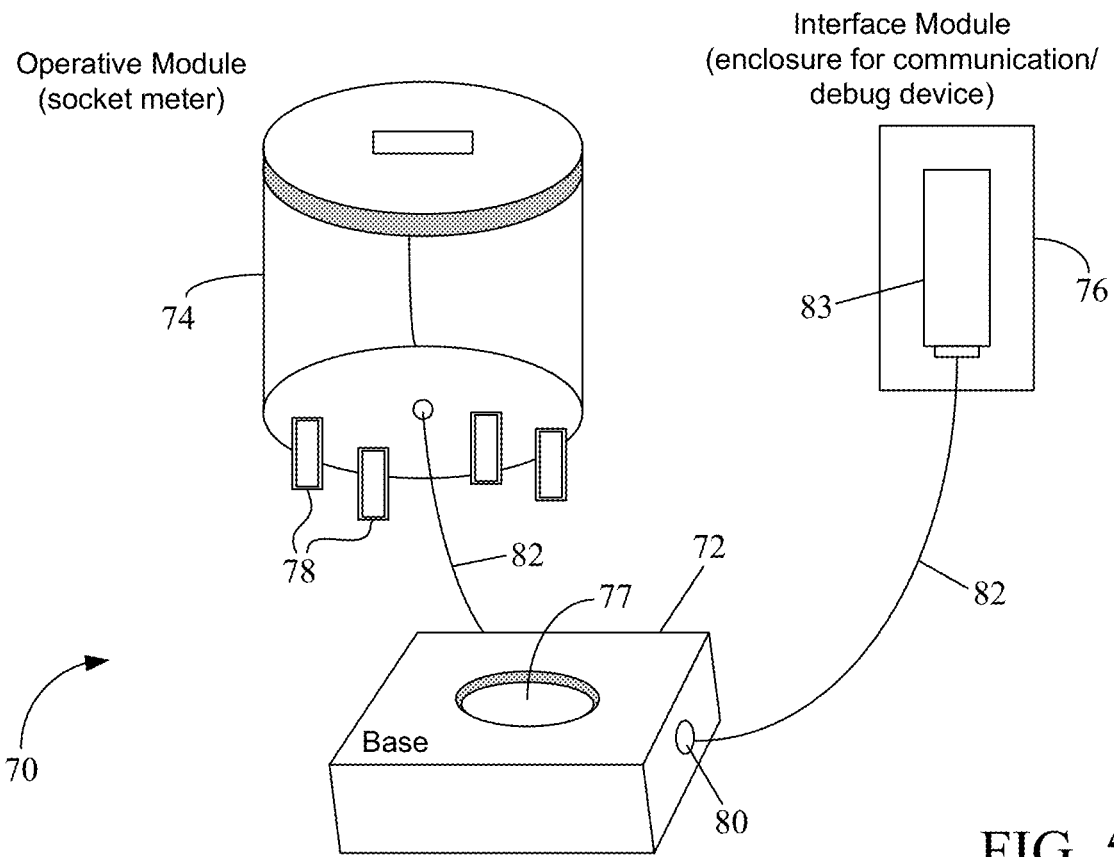
FIG. 5 shows an exemplary electrical unit implementing the divided access aspect discussed with reference to the electrical unit in the embodiment of FIG. 1 using a wired connection through an intermediate connector.

FIG. 5 shows an exemplary electrical unit 70 implementing the divided access aspect discussed with reference to the electrical unit 10 in the embodiment of FIG. 1 using a wired connection through an intermediate connector 72. The electrical unit 70 may include the intermediate connector 72, an operative module 74 and an interface module 76. In the embodiment of FIG. 5, the operative module 74 is a self-contained meter, such as a socket meter and the intermediate connector 72 is a base that functions as a socket for the meter 74. The meter 74 may operatively fit into the base 72 via a meter receptor port 77 and electrical connections 78. Thus, although the meter 74 itself may not have any openings or access to the electrical circuitry for communication and/or diagnostics, the electrical circuitry—here, the interface module 76—may be wired into the electrical meter base socket 72 into which the meter plugs. For example, as shown in FIG. 5, the socket meter base 72 may have openings—one of which is shown and identified using the reference numeral "80"—that allow one or more communication/debugging interface connections from the meter 74, such as a USB cable 82, to exit into the meter socket base 72 and be wired from there to an external enclosure 76 where the communication upgrade/troubleshooting circuitry (or interface) may be housed. In the embodiment of FIG. 5, the interface module 76 is shown as a rectangular protrusion that may have an access door or side 83 openable by a homeowner or low-skilled technician to access the communication and/debug device(s) contained in the interface module 76. The door may have sufficient hermetic sealing when closed to ensure that any communication/diagnostic hardware added to the meter into the protrusion is protected from the natural elements in line with the meter's environmental rating. In one embodiment, all of the components shown in FIG. 5 may be housed within a single enclosure (not shown) constituting the electrical unit 70. In that case, there may be a hermetically-sealed door in the enclosure to protect meter electronics and circuits in the interface module from the natural elements in line with the meter's environmental rating. The enclosure-based door may be opened by a non-electrician user to access the interface module 76 inside the enclosure, without allowing the user to access the operative module 74. In one embodiment, the operative module 74 and the base 72 may be housed in an enclosure, whereas the interface module 76 may be a protrusion attachable to the operative module 74 via the interface cable 82 available through the opening 80 in the base 72. While the embodiment in FIG. 5 shows the application of a cable-based design to a socket meter, it is understood that the teachings of the present disclosure cover the usage of such interface cables that exit a base/enclosure to allow for the addition or upgrade of one or more debug/communication modules to a transformer-rated meter as well.

It is noted that the meters 61, 74 shown in FIGS. 4-5, respectively, may be utility monitoring meters configured to monitor at least one of the following: a household utility such as electricity, gas, or water; electricity voltage; electricity current; electricity power; electricity frequency; electricity power factor; and electricity phase angle. However, the teachings of the present disclosure cover both self-contained and transformer-rated electrical energy Watt-Hour meters with or without monitoring of other aspects of electricity (such as voltage, current, frequency, power, phase angle, power factor, and the like) with diagnostic and/or communication interfaces made accessible to the homeowner or a low-skilled technician in the field to facilitate diagnosis, firmware/configuration updates, and addition, upgrade, or replacement of functionality, especially communication functionality.

The discussion below explains how the divided access aspect discussed with reference to the exemplary embodiments in FIGS. 1-5 may be utilized in practice.

The monitoring and reporting device—such as the electrical unit in any of the FIGS. 1-5—may be initially installed by an electrician with either the core containing the initial communication interfaces required, or with modular plug-in hardware for the initial interfaces required. During the installation, the electrician may prefer to use the home network as the backhaul (for communication with a remote management equipment) due to lower hardware and recurring costs, while maintaining an easy and low-cost option of adding cellular communication at a later stage if necessary. The new installation may be monitored for a few weeks for communication reliability and regularity. If it is satisfactory, the installation is left with home networking as the backhaul. However, if the home network backhaul is found to be inadequate, a cellular communication module may be shipped to the homeowner to be installed by the homeowner by accessing the interface module of the monitoring device or an installation can be arranged by a low-cost technician who can also access the interface module. In the event of a home network protocol obsolescence, a new module may be shipped to the homeowner or an installation arranged through a low cost technician to add a new protocol capability to the home network. The new module may replace a previously installed module, or override the functionality of an already-included element in the core of the product. Similarly, for a monitoring device where cellular networking was previously added using a module, in the event of a cellular network sunset by the carrier involved, a new module supporting newer protocol(s) may be shipped to the homeowner or installation arranged by a low cost technician through access to the device's interface module. In this manner, communication system upgrades may be performed without the need to send a qualified electrician to the site.

In the event of an issue with the monitoring unit—such as the electrical unit in any of the FIGS. 1-5, the homeowner's access may be used to help debug the issue remotely over a phone or an Internet-based chat session. The homeowner may be remotely instructed—by a service person from a remote support center—to observe the diagnostic indicators as well as use appropriate diagnostic interfaces in the homeowner accessible area of the monitoring unit to help diagnose the issue(s) affecting the performance of the unit. Similarly, a low expertise technician could be remotely assisted to troubleshoot an issue on site using these indicators and interfaces. In this manner, diagnostics or troubleshooting of the monitoring unit may be performed without the need to send a qualified electrician to the site.

Figure 6:
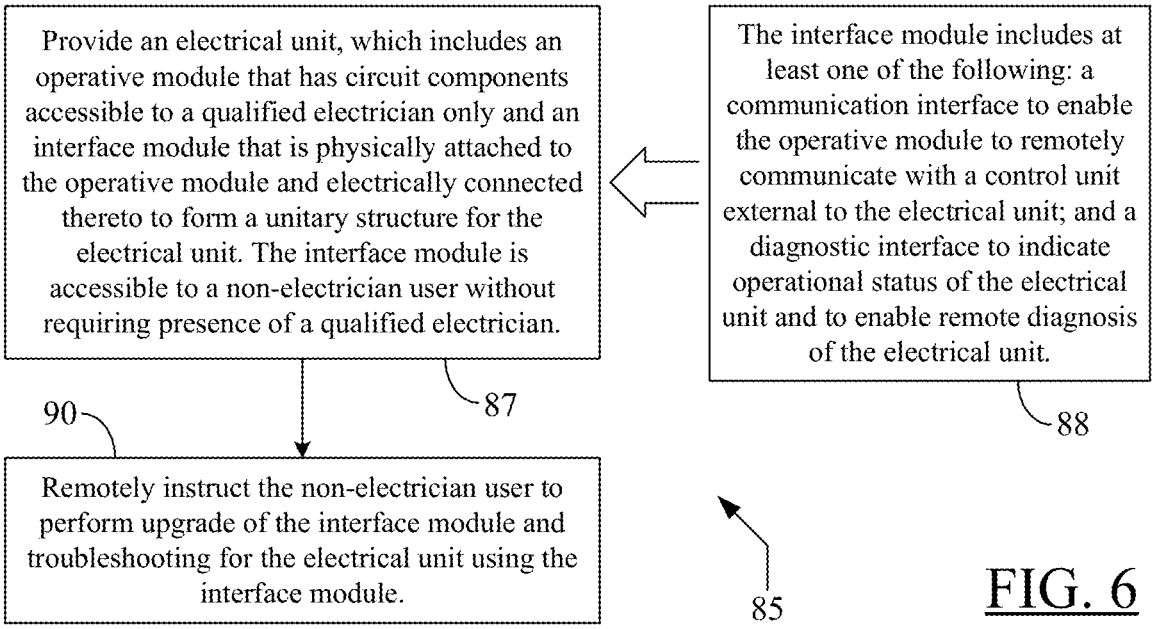
FIG. 6 is an exemplary flowchart illustrating how the divided access methodology may be used to perform upgrade and troubleshooting of an electrical unit according to one embodiment of the present disclosure.

FIG. 6 is an exemplary flowchart 85 illustrating how the divided access methodology may be used to perform upgrade and troubleshooting of an electrical unit, such as the electrical unit 10 in FIG. 1, according to one embodiment of the present disclosure. At block 87, the method may include the step of providing the electrical unit, which, as mentioned before, may include an operative module, such as the operative module 12 in FIG. 1, and an interface module, such as the interface module 14 in FIG. 1. The operative module may have circuit components accessible to a qualified electrician only, whereas the interface module may be accessible to a non-electrician user without requiring the presence of a qualified electrician. In particular embodiments, the operative module may include different types of PCBs for a modular interconnect scheme, as discussed in more detail below with reference to FIGS. 7-9. The interface module may be physically attached to the operative module and electrically connected thereto to form a unitary structure for the electrical unit. In one embodiment, the interface module may be physically attachable to the operative module and, upon attachment, the two modules may form a unitary structure for the electrical unit.

As noted at block 88 and discussed before, the interface module may include at least one of the following: (i) a communication interface, such as the communication interface 16 in FIG. 1, to enable the operative module to remotely communicate with a control unit external to the electrical unit, and (ii) a diagnostic interface, such as the diagnostic interface 18 in FIG. 1, to indicate operational status of the electrical unit and to enable remote diagnosis of the electrical unit.

As noted at block 90, the method in the embodiment of FIG. 6 may further include the step of remotely instructing the non-electrician user to perform upgrade of the interface module and troubleshooting for the electrical unit using the interface module. In this manner, the divided/bifurcated access methodology may be used to perform upgrade and troubleshooting of an electrical unit as per teachings of the present disclosure.

Thus, the modular hardware approach as per teachings of the present disclosure provides the ability to add new or upgraded communication interfaces to a monitoring and reporting device by separating dangerous/sensitive/complex circuit elements from the homeowner or low-skilled technician so that the homeowner or low-skilled technician can perform field upgrades of some functionality at low cost. Although the discussion above is primarily provided using a renewable energy monitoring and reporting device as an example of the electrical unit in FIGS. 1-5, it is noted that the discussion equally applies to more complex devices as well such as, for example, devices involving monitoring, reporting, interconnection, and control of a PV solar system; an electrical energy monitoring unit; an electrical switch such as, for example, energy storage, islanding, or disconnect switches; a circuit load panel such as critical load panels; an energy storage meter such as, for example, a battery charge monitor; an electric vehicle charging unit; and the like. Generally, as per the present disclosure, more complex and unsafe portions of such devices may be restricted to electrician access only, whereas safe areas may be made accessible to a non-electrician user or a low expertise technician to help diagnose issues with the device and/or upgrade a device functionality such as communication capability.

Although the example in the embodiment of FIG. 2 shows voltage connections, current transformer connections, RS485 ports, and the electrical circuit board as the areas to be included in the higher access level protection domain (electrician zone), it is noted that the elements to be included in the higher access level zone versus the lower one—which is to be accessible to a non-electrician user—may be determined according to the exact design of the product in question and such criteria as safety, complexity, and sensitivity of the elements involved.

Furthermore, although previous discussion mentions USB and Ethernet as the interfaces for upgrades and troubleshooting and LEDs as diagnostic indicators, the teachings of the present disclosure are not limited to these examples only. In particular embodiments, a debug/upgrade interface—such as the diagnostic interface 18 or the interface module 14 itself in FIG. 1—may include one or more of the following interfaces or ports: one or more USB interfaces, one or more Ethernet interfaces, one or more miniPCIe interfaces, one or more PCMCIA interfaces, one or more USNAP interfaces, one or more DB9 ports, and so on. As is understood, a USNAP interface may enable a Home Area Network (HAN) to communicate with utility systems, energy gateways, or other devices within the home. The diagnostic interface, such as the diagnostic interface 18 in FIG. 1, may include LEDs as diagnostic/troubleshooting indicators, or a Liquid Crystal Display (LCD) as a diagnostic indicator, or some other indicator(s) for audible and/or visible alert.

In certain embodiments, the electrical units as per teachings of the present disclosure may use plastic or any other material for the enclosures. For example, the enclosure(s) may be of metal (with appropriate designs to allow for antennas in modular interfaces to be added if RF modular interfaces are to be supported) or of any other material suitable for implementing the divided access aspect as per the present disclosure. Similarly, in some embodiments, the layout of the two access areas—one for the qualified electrician and the other for a non-electrician user—may be different from the nested (FIG. 2) and side-by-side (FIG. 3) configurations discussed before.

As noted before, many different types of communication interfaces may be included as part of an interface module, such as the interface module 14 in FIG. 1. For example, in particular embodiments, a communication interface, such as the communication interface 16 in FIG. 1, may include one or more of the following interfaces: a cellular telecommunications interface such as, for example, interface for 3G (Third Generation) or 4G (Fourth Generation) cellular network; a Wi-Fi interface, an RF interface such as, for example, a Bluetooth® interface; an Ethernet port/interface; a Small Computer System Interface (SCSI) interface; a Fibre Channel interface; a Firewire® (IEEE 1394) interface; and so on. The communication interface may include any suitable circuits, media and/or protocol content for connecting the electrical unit to a network—whether wired or wireless. In various embodiments, the network may include the Internet, Local Area Networks (LANs), Wide Area Networks (WANs), wired or wireless Ethernet, telecommunication networks, or other suitable types of networks.

The present disclosure applies to a transformer-rated meter, a self-contained meter such as a socket meter, or any other type of energy or utility meter. In the example in FIG. 2, a two-layer enclosure arrangement is shown that allows homeowners and low-cost technicians access to the diagnostic and communication interfaces. In an alternate arrangement, the enclosure of the monitoring unit may have its own door that can be opened by the homeowner/low cost technician to access the interface module housed within the enclosure; the operative module, however, may remain shielded from the homeowner. In another embodiment, the enclosure housing the interface module may be set into the device/meter itself and contained within the device envelope, or it could be an outward protrusion from the meter as shown, for example, in the embodiments of FIGS. 4-5.

The teachings of the present disclosure may lower the initial hardware cost across a large number (fleet) of distributed energy assets by eliminating the need for including a cellular communication interface as part of every unit and restricting it to only units that really need it. As discussed before, a wi-fi interface may be initially installed in a monitoring unit. If that interface works satisfactorily or upgraded with the help of the homeowner for satisfactory backhaul through home wi-fi network, then there may be no need to install or activate a cellular interface on the device. Thus, recurring costs are also lowered across the fleet by using cellular interfaces only on installations where cellular communication is truly required. If every electrical unit in the fleet is installed/activated with a cellular communication option, a minimum monthly charge would need to be paid on every unit, thereby increasing the operating cost of the energy assets. Hardware costs from a cellular network sunset or home network protocol obsolescence are reduced as well because only the affected communication module/interface needs to be added/replaced. Labor costs from a cellular network sunset or home network protocol obsolescence are similarly reduced because such a replacement can be performed by the homeowner or a low cost technician instead of a more expensive electrician. Furthermore, troubleshooting costs are reduced and outcomes are improved too. By providing the homeowner with access to debug interfaces and diagnostic indicators, remote troubleshooting may be made much more effective, leading to fewer truck rolls with qualified electricians, lower costs, faster resolution, and higher customer satisfaction.

Figure 7A:
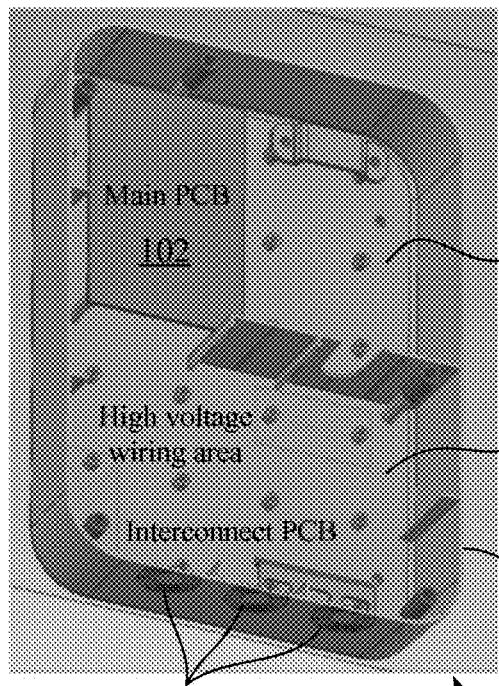
FIGS. 7A-7C illustrate perspective views of an exemplary electrical unit implementing divided access using a nested configuration according to one embodiment of the present disclosure.
Figure 7B:
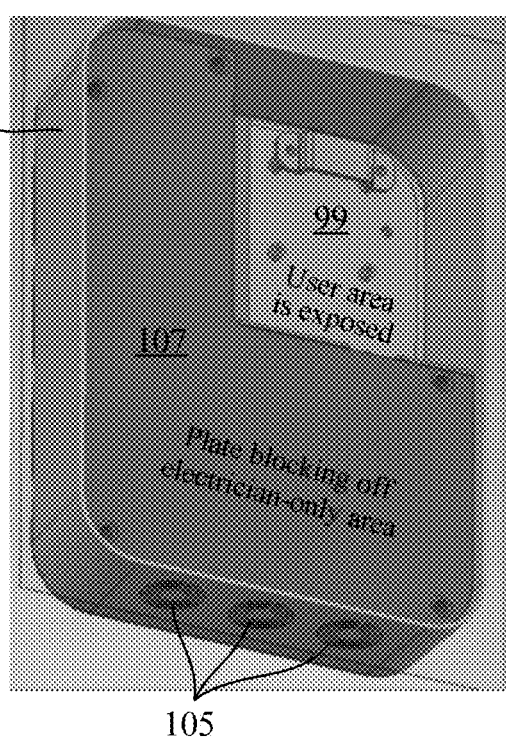
Figure 7C:
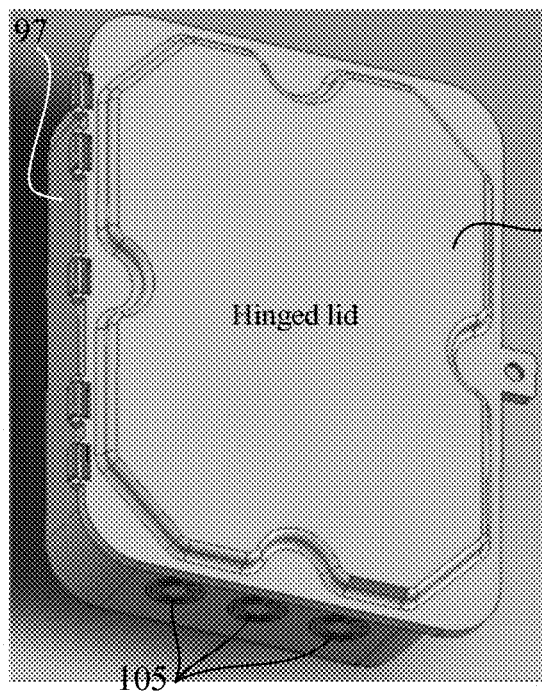
Figure 8:
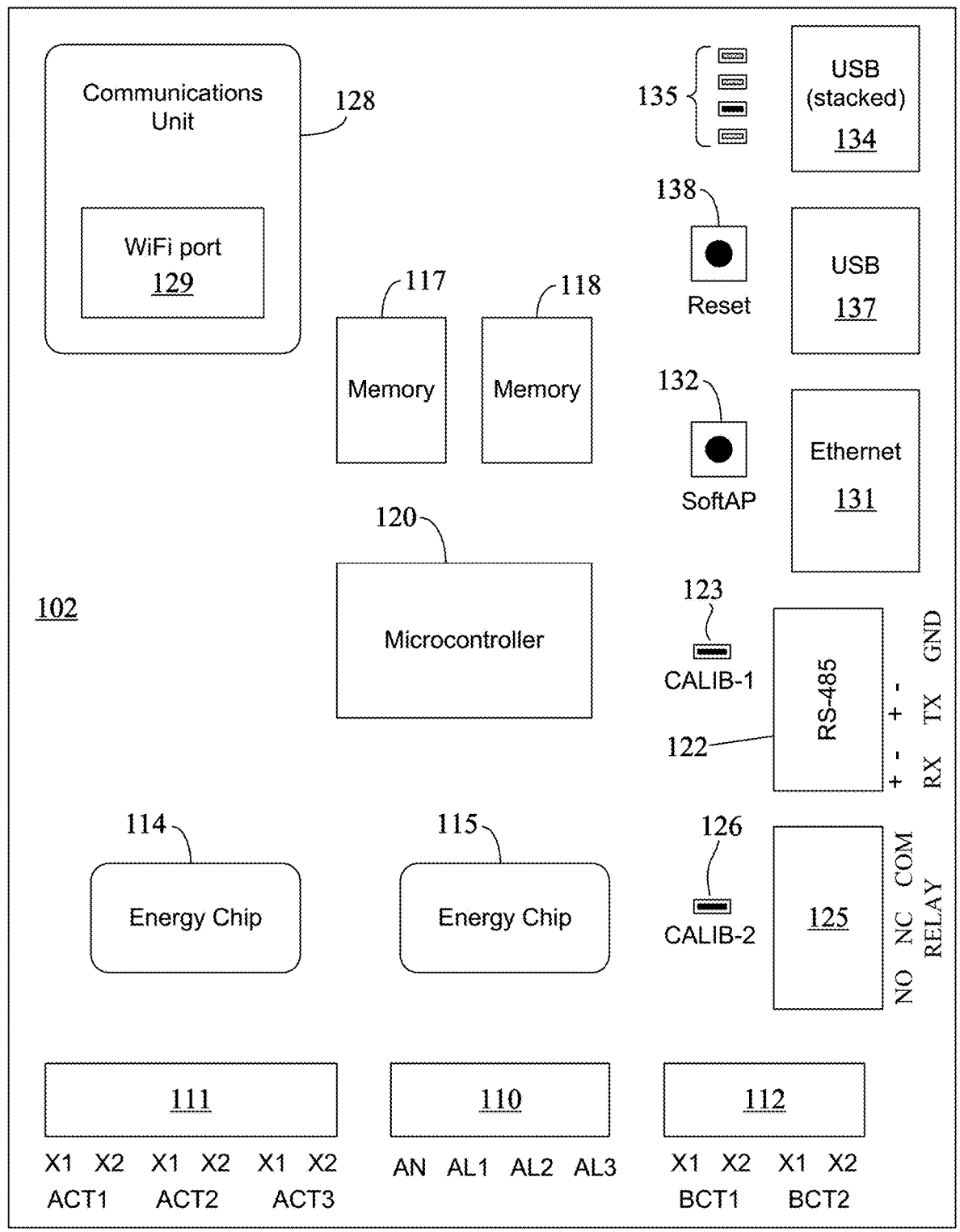
FIG. 8 shows exemplary architectural details of the main PCB in the electrical unit of FIG. 7 as per particular embodiments of the present disclosure.
Figure 9A:
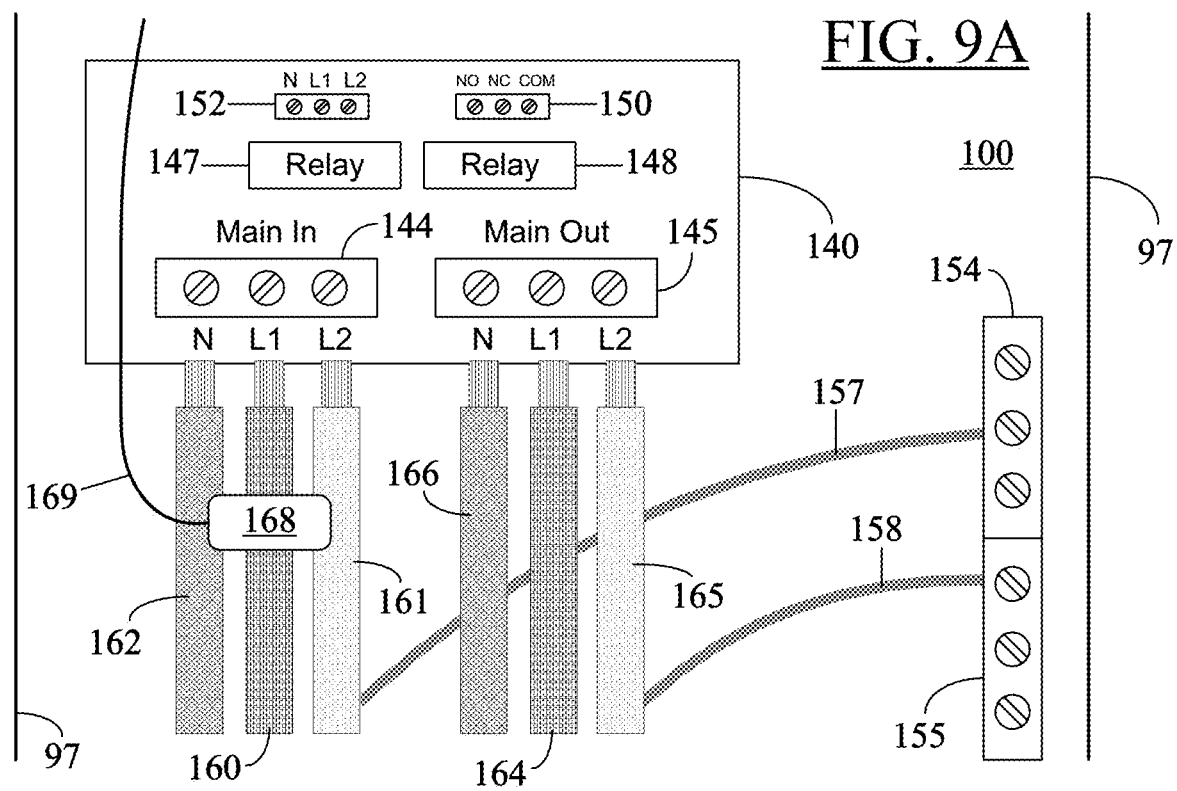
FIGS. 9A-9B depict exemplary interconnect PCBs populated with circuit components matching those of the main PCB as per a particular operating configuration of the electrical unit in FIG. 7.
Figure 9B:
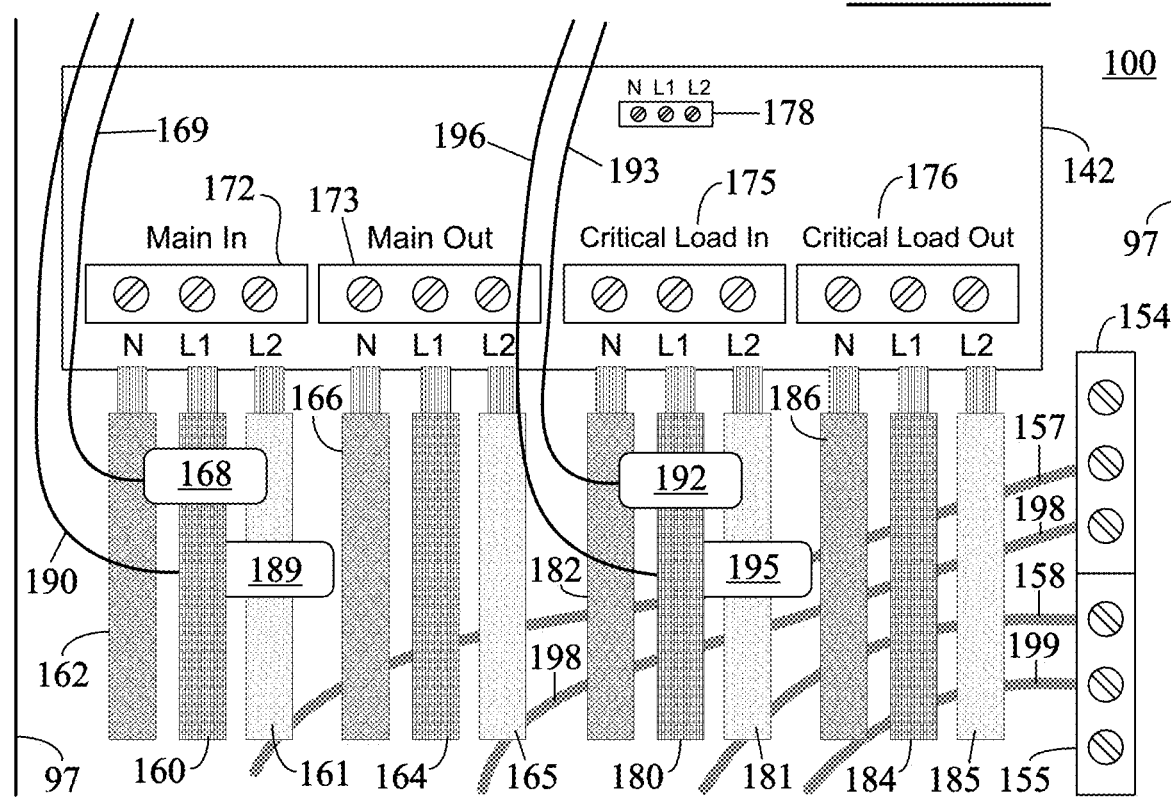

FIGS. 7A-7C (collectively "FIG. 7") illustrate perspective views of an exemplary electrical unit 95 implementing divided access using a nested configuration according to one embodiment of the present disclosure. The electrical unit 95 may be a renewable energy monitoring unit. FIGS. 8-9 provide additional architectural details of the electrical unit 95 in FIG. 7. As mentioned in the context of FIG. 1, it is noted here that the discussion of FIGS. 7-9 equally applies to other types of electrical units as well such as, for example, an electrical switch, a circuit load panel, an energy storage meter, an electrical energy monitoring unit, an electrical vehicle charging unit, a utility meter, and the like. As shown in FIGS. 7A-7C, the electrical unit 95 may include a housing or base 97 made of plastic or other suitable non-conductive material. The interior space of the housing 97 may be divided into two non-overlapping areas: a user-accessible area 99 to receive circuit components forming the interface module portion of the electrical unit 95, and a high voltage wiring area 100 for circuit components forming the operative module portion of the electrical unit 95. In addition to the modularity in the communication options (as discussed before with reference to FIG. 2, for example), the electrical unit 95 also may provide modularity to the electrical interconnect scheme in the secure or protected portion (which is not accessible by a non-electrician user) 100 by having a main Printed Circuit Board (PCB) 102 in the secure portion that is selectively populated with certain circuit components and that contains electrical connections to enable the electrical unit 95 to be operated in a number of different operating configurations depending on which components are populating the main PCB 102. An exemplary circuit configuration for the main PCB 102 is shown in FIG. 8, which is discussed later below. A smaller, interconnect PCB also may be provided in the protected portion 100—as indicated in FIG. 7A and discussed in more detail with reference to FIGS. 9A-9B later. The interconnect PCB may be hardware-paired with the main PCB to facilitate wiring of the main PCB via the interconnect PCB, as discussed in more detail later below. Thus, a first portion of the circuit components in the operative module of the electrical unit 95 may populate the main PCB 102, whereas a second portion of the circuit components in the operative module may populate the interconnect PCB, as discussed later below.

FIGS. 7A-7C also show knockouts (or openings) 105 in the housing 97 to allow entry of different wires into the electrical unit 95 for further connections to the interconnect PCB and the main PCB. For example, in case of the electrical unit 95 being a renewable energy monitoring unit, these wires may include wires carrying current generated by a renewable energy source such as a PV solar array so as to measure energy generation as well as wires carrying voltage being supplied to a household or other entity so as to measure renewable energy consumption.

The divided access in the embodiment of FIG. 7 may be similar to that illustrated in the embodiment of FIG. 2. Thus, for example, as shown in FIG. 7B, a removable plate or inner cover 107 may be securely placed over the electrician-only (high voltage) area 100 to block it off. In particular embodiments, the plate 107 may be of plastic or other similar non-conductive material allowing its secure mounting and dismounting. Furthermore, as shown in FIG. 7C, a hinged outer cover 108 may be placed over the inner cover 107 to completely close the interior of the housing 97, similar to the nested configuration shown in the embodiment of FIG. 2. The outer cover 108 may be a hinged lid made of plastic or other non-conductive material and may be removable by a non-electrician user to access the user area 99 where interface module-related circuit components may be located. It is understood that the nested configuration shown in FIG. 7 is by way of an example only. The circuit details in the exemplary embodiments of FIGS. 8-9 may be implemented in the divided access configurations of FIGS. 3-5 as well, with suitable modifications (if necessary). However, for the sake of brevity, all such implementations are not shown.

FIG. 8 shows exemplary architectural details of the main PCB 102 in the electrical unit 95 of FIG. 7 as per particular embodiments of the present disclosure. As mentioned before, the ability to selectively populate the main and interconnect PCBs may add modularity to the electrical interconnect scheme (within an operative module) in addition to the modularity in communication options discussed before in the context of an interface module. A device, such as the electrical unit 95 in FIG. 7, may support multiple configurations depending on what components are populated within the device, creating a few different Stock Keeping Units (SKUs) that could be used for a few different applications. Thus, for example, a manufacturer may have different electrical units with different SKUs—one SKU per product application. The discussion below addresses a few exemplary applications or device configurations based on selective population of the main PCB in the device. However, it is observed that the discussion is not limited to these exemplary applications, but covers any extensions of these use cases as well.

As shown in FIG. 8, the main PCB 102 may include one or more of the following major circuit components relevant to the discussion of the exemplary use cases below:

(i) A voltage connector "A" 110 having a neutral terminal (AN), a first line terminal (AL1), a second line terminal (AL2), and a third line terminal (AL3) to accommodate line voltages for three-phase PV metering.

(ii) A first Current Transformer (CT) connector "A" 111 having three input terminals ACT1, ACT2, and ACT3. As shown, each input terminal of the ACT connector 111 may include two current lines—X1 and X2—for metering of PV-generated DC current.

(iii) A second CT connector "B" 112 having two input terminals BCT1 and BCT2, each terminal with two current lines X1 and X2. In some embodiments, the BCT connector 112 may have three input terminals like the ACT connector 111.

(iv) One or more energy-metering chips or Integrated Circuits (ICs). Two such energy-metering chips 114-115 are shown in the embodiment of FIG. 8.

(v) Some resistors (not shown) and other components that help facilitate the re-wiring of the circuits for the different use cases (some of which are discussed below).

In certain embodiments, in addition to the above circuit components and associated electrical connections/wiring (not shown) to make the PCB 102 operational in the electrical unit 95, the PCB 102 also may include one or more of the following additional components and related electrical connections/wiring:

(i) On-board memory, such as the memory units 117-118.

(ii) A microcontroller or a microprocessor-based system 120 for operative control over various circuit components populating the PCB 102. In one embodiment, the microprocessor-based system may have a processor, flash memory, and Random Access Memory (RAM) units as separate chips.

(iii) An RS-485 port/connector 122 having Receive (RX), Transmit (TX) and Ground (GND) terminals, as shown.

(iv) A calibration indicator 123 may be used for the energy-metering chips(s) 114-115 and associated circuitry.

(v) An electrical/safety relay unit 125 with Normally Open (NO) contacts, Normally Closed (NC) contacts, and a Communication (COM) port. A calibration indicator 126 may be used during calibration or testing of the relay 125.

(vi) A communications unit 128 containing hardware and software to support various types of wireless communications such as, for example, wireless cellular communication, WiFi communication, and so on. In some embodiments, the communications unit 128 may include a dedicated WiFi port 129, as illustrated.

(vii) An Ethernet port 131 along with a Software-enabled Access Point (SoftAP) 132.

(viii) A stacked USB port 134 to accommodate up to four different USB peripherals, and corresponding indicator lights 135. The PCB 102 also may include a non-stacked, single USB port 137. In particular embodiments, one or more of these USB ports may be accessible to a non-electrician user for communication upgrade or remote diagnosis of the main PCB 102 without removing the inner cover/plate 107 (FIG. 7B).

(ix) A PCB reset button 138.

It is noted here that some or all of the above-mentioned additional components may be present/removed from the PCB 102 based on the need for them in the specific application. For example, WiFi and Ethernet ports may or may not be populated with appropriate hardware (and associated microcode or driver software) in the PCB 102 based on the mode of communication planned to be used for the electrical unit 95. Generally, the PCB 102 may be selectively populated with only those components that may be needed for a specific operating configuration desired for the electrical unit 95. As a result, the same (generic) PCB 102 layout may be cost-effectively used in all different configurations (or applications) of the electrical unit 95; the PCB 102 would be selectively populated using application-specific circuit components. For example, if the electrical unit 95 is to be used as a renewable energy monitoring unit, then the PCB 102 may be populated with circuit components that facilitate such operational configuration of the electrical unit 95. On the other hand, if the electrical unit 95 is to be used as an energy storage meter, then the PCBs 102 in such electrical units may be populated with storage metering-related circuit components only. In this manner, a few different SKUs may be created for the electrical unit 95—each SKU may be used for a different application/configuration of the unit 95.

The discussion below addresses a few operating configurations for the electrical unit 95 and the changes in the circuit and functionality of the PCB 102 that may be facilitated by selective populating or de-populating the PCB 102 with certain components to enable the PCB-containing electrical unit 95 to perform in the desired operating configuration. For the discussion below, it is assumed that each energy-metering chip 114-115 is capable of metering up to three Current Transformers (CTs) and capable of associating a voltage between two connection points with each CT.

1. Single phase PV metering only: In this case, only one path of energy (generated by PV source) needs to be metered. Therefore, the PCB 102 may be populated with one energy-metering chip (like the chip 114), one voltage connector (like the connector 110), and one CT connector (like the connector 111) as major components. Of course, as mentioned before, the PCB 102 also may contain some resistors and other components that help facilitate the re-wiring of the circuit for this use case. For this single-phase PV metering use case, the on-board voltage connector may be reduced to L1 and L2 terminals only, and the on-board CT connector may be reduced to a single CT input. The voltage between L1 and L2 may be associated with the lone CT input (on the energy-metering chip) by populating the PCB 102 with certain resistors that would connect the L1 and L2 inputs to the associated terminals of the on-board energy-metering chip.

2. Single phase PV metering with home energy consumption measurement: Like the previous use case, this use case also requires three major components on the PCB 102—one energy-metering chip, one voltage connector, and one CT connector. However, this use case differs from the previous one in the sense that it also includes home energy consumption measurement. In the background of a split phase system, the home energy consumption may be represented by the L1 current associated with L1-N voltage and L2 current associated with L2-N voltage. The voltage connector thus would have at least three positions to accept—L1, L2, and N terminals. Similarly, the CT connector would also accept three inputs (for example, the ACT1, ACT2, and ACT3 inputs in FIG. 8)—one representing the L1 current on the PV branch to be associated with the L1-L2 voltage on the metering chip and the other two terminals measuring L1 and L2 currents on the lines between the AC panel (in the home) (not shown) and the electrical grid (not shown) to which the PV system may have been connected—these L1 and L2 currents may be associated with L1-N and L2-N voltages on the energy chip, respectively, by populating the PCB 102 with the requisite resistors.

3. Three phase PV metering only: In this case, only one path of energy is measured, but it is a 3-phase measurement. Like the previous two cases, the PCB 102 in this case also may be populated with three major components—one energy-metering chip, one voltage connector, and one CT connector. The voltage connector may accept L1, L2, and L3 voltages, and a neutral (N) (if available). The first CT input (for example, the ACT1 input in FIG. 8) may accept outputs of CTs (not shown) around the three-phase conductors. Some exemplary CTs around conductors are shown in the embodiment of FIG. 9B, which is discussed later below. On the energy-metering chip, each CT input (into the metering chip) may be associated with L1, L2, and L3 voltages, with or without a neutral (N), by populating the PCB 102 with the requisite resistors.

4. Three phase PV metering plus 3-phase home energy consumption metering: In this case, two 3-phase paths of energy are measured. Hence, in one embodiment, the PCB 102 in this case may be populated with the following four major components—two energy-metering chips (such as the chips 114-115 in FIG. 8), one voltage connector (such as the connector 110 in FIG. 8), and two CT connectors (such as the ACT connector 111 and BCT connector 112 in FIG. 8). The first CT connector 111 may have three inputs (ACT1, ACT2, and ACT3) and these three inputs may be wired to the first energy-metering chip 114. The second CT connector 112 may be similar to the first CT connector 111 and may have the same voltages associated with it. In other words, the BCT connector 112 also may have three inputs BCT1, BCT2, and BCT3 (although two are shown in FIG. 8). These three inputs of the BCT connector 112 may be wired to the second energy-metering chip 115 in a manner similar to the wiring of the inputs of the ACT connector 111 to the energy chip 114.

5. Single phase PV plus storage metering with critical loads: In this case, the renewable (PV) energy generation as well as storage are metered along with measurement of energy consumption by critical loads. A critical load may be something that should have backup power in case of a power outage such as, for example, a refrigerator or basic lighting in a home. Hence, in one embodiment, the PCB 102 in this case may be populated with the following four major components—two energy-metering chips (such as the chips 114-115 in FIG. 8), one voltage connector (such as the connector 110 in FIG. 8), and two CT connectors (such as the ACT connector 111 and BCT connector 112 in FIG. 8). The first CT connector 111 may have three inputs (ACT1, ACT2, and ACT3) and may be associated with L1 for up to three monitored paths. The second CT connector 112 also may have three inputs BCT1, BCT2, and BCT3 (although two are shown in FIG. 8) and may be associated with L2 for up to three monitored paths.

As discussed above, selective population of the PCB 102 with desired circuit components may allow the electrical unit 95 to be operated in multiple configurations without the need to a design and manufacture a different PCB for each such configuration. Thus, the operating configuration of the electrical unit 95 may be made modular based on the components populating the main PCB 102. It is noted that, in particular embodiments, additional modularity also may be accomplished using appropriate interconnect components, which will be present within the same enclosure 97 (FIG. 7). The wiring terminals (not shown in FIG. 7, but shown in FIG. 9) in the enclosure 97 will allow an installer (such as, for example, a qualified electrician) to wire up a system of one of the above configurations/use cases, paired with the PCB 102 that is populated with components to match that particular application.

As discussed in more detail with reference to FIG. 9, an interconnect PCB may be placed within the housing 97 (as indicated in FIG. 7A) and hardware-paired with the main PCB 102. The interconnect PCB may be smaller in size than the main PCB and may be selectively populated with circuit components that are based on and hardware-paired with the components in the main PCB 102 so as to facilitate wiring of the main PCB 102 via the interconnect PCB to enable the electrical unit 95 to be operated in one or more of the different operating configurations mentioned earlier.

FIGS. 9A-9B depict exemplary interconnect PCBs 140, 142, respectively, populated with circuit components matching those of the main PCB as per a particular operating configuration of the electrical unit 95 in FIG. 7. As noted above, an interconnect PCB may be placed in the high-voltage wiring area 100 to initially receive the external wires—for example, wires carrying voltages or currents to be measured or monitored using the electrical unit 95—and may operate as an intermediate terminal through which an electrician may further wire up the externally-received wiring up to the main PCB 102. The interconnect PCB 140 in FIG. 9A relates to the "single phase PV metering only" configuration discussed earlier. On the other hand, the interconnect PCB 142 in FIG. 9B relates to the "single phase PV plus storage metering with critical loads" configuration discussed earlier.

Referring now to FIG. 9A, the interconnect PCB 140 may be populated with a mains-in voltage connector 144, a mains-out voltage connector 145, a first relay unit 147 and a second relay unit 148, a relay controller 150, and a voltage-tapped terminal 152. The enclosure 97 may include a pair of wiring terminals 154-155 to receive the mains line inputs L1 and L2 (and N, if available) from a source external to the enclosure 97 and also to connect the mains line outputs L1 and L2 (and N, if available) thereto for further connections to electrical points external to the enclosure 97. In particular embodiments, the mains line inputs may be used to connect up the PV output from an inverter and the mains line outputs may connect to the electrical mains panel (which may be driving an AC load) so that the energy from the PV inverter may flow through the conductors in the housing 97 and, hence, may be metered by the included current transformer(s). The knockouts 105 in the enclosure 97 may facilitate connections to/from the external points/source. In the embodiment of FIG. 9A, the wire leads 157 collectively represent the wiring of the L1 lines on the mains-in and mains-out connectors 144-145, and the wire leads 158 collectively represent the wiring of the L2 lines on the mains-in and mains-out connectors 144-145. Two relay units 147-148 may be needed to disconnect the circuit by opening the L1 and L2 circuits. In some embodiments, the two relays may be implemented as a combined two-pole relay in one unit. The mains-in connector 144 is shown to receive the wires 160-162 for line inputs L1, L2, and N (if available), respectively. Similarly, the outgoing wires 164-166 for line outputs L1, L2, and N (if available), respectively, may be connected to the mains-out connector 145, as shown. A current transformer (CT) 168 with leads 169 may be provided within the enclosure 97 and the CT 168 may be lined up with L1 input, as shown.

For the "single phase PV metering only" use case under consideration in the context of FIG. 9A, the components populating the interconnect PCB 140 may be based on and hardware-paired with the components populating the main PCB 102 for the given use case. As a result, the operation of the electrical unit 95 in a given configuration or use case may be facilitated when an installer (for example, a qualified electrician) wires up a system of the desired configuration using the matching pair of PCBs 102, 140. In one embodiment, the interconnect PCB 140 may be of dimensions 6"×2.5", whereas the main PCB 102 may be 12"×10" in dimensions.

In the use case associated with FIG. 9A, the interconnect board 140 may tap L1, L2, and N (if available), and offer a connection terminal—such as the voltage-tapped terminal 152—to wire these up to the main PCB 102. As noted above, the CT 168 may be lined up with L1 so that the current on L1 (mains input 160 in FIG. 9A) can be measured. The CT leads 169 may connect up to ACT1 input (FIG. 8) on the main PCB 102. Relays 147-148 on the interconnect board 140 may be controlled—via the controller unit 150—by the relay outputs (of the relay unit 125 in FIG. 8) on the main PCB 102.

On the other hand, when the main PCB 102 is populated with components related to the earlier-discussed "single phase PV plus storage metering with critical loads" configuration, the interconnect PCB 142 may be hardware-paired with the main PCB 102 by populating it with the components based on the components populating the main PCB 102 (as shown in FIG. 9B) to enable the electrical unit 95 to operate in the main PCB-based configuration. Thus, as shown in FIG. 9B, the interconnect PCB 142 may be populated with a mains-in voltage connector 172 (similar to the connector 144 in FIG. 9A), a mains-out voltage connector 173 (similar to the connector 145 in FIG. 9A), a critical load-in voltage connector 175, a critical load-out voltage connector 176, and a voltage-tapped terminal 178 (similar to the terminal 152 in FIG. 9A). For ease of discussion, other components common between the embodiments of FIGS. 9A and 9B are identified using the same reference numerals. Thus, as shown FIG. 9B, the enclosure 97 also may include the wiring terminals 154-155, the incoming wires 160-162, the outgoing wires 164-166, and the CT 168 with leads 169. Additionally, the enclosure 97 also may include the wires 180-182 for critical load inputs L1, L2, and N (if available), respectively, as well as the wires 184-186 for the critical load line outputs L1, L2, and N (if available), respectively. As mentioned before, the knockouts 105 in the enclosure 97 may facilitate wiring to/from the external points/sources.

As can be seen from FIG. 9B, there may be no relays in the configuration of FIG. 9B. However, there may be two pairs of current transformers (CTs) in the embodiment of FIG. 9B—each pair being associated with the pair of line inputs L1 and L2. Thus, in addition to the first CT 168

(which may be lined up with the mains input L1 as shown), the configuration in FIG. 9B also may include a second CT 189 lined up with the mains input L2 and having the leads 190, a third CT 192 having the leads 193 and lined up with the critical loads line input L1, and a fourth CT 195 having the leads 196 and lined up with the critical loads line input L2, as shown. Furthermore, as in case of the embodiment in FIG. 9A, the wire leads 157 in the embodiment of FIG. 9B collectively represent the wiring of the L1 lines on the mains-in and mains-out connectors 172-173, and the wire leads 158 collectively represent the wiring of the L2 lines on the mains-in and mains-out connectors 172-173. Additionally, the enclosure 97 also may include the wire leads 198 that collectively represent the wiring of the L1 lines on the critical load-in and critical load-out connectors 175-176, and the wire leads 199 that collectively represent the wiring of the L2 lines on the critical load-in and critical load-out connectors 175-176. In one embodiment, the interconnect PCB 142 in FIG. 9B may be of dimensions 9"×2.5", whereas the main PCB 102 may be 12"×10" in dimensions.

In the use case associated with FIG. 9B, the interconnect board 142 may tap L1, L2, and N (if available) for the main path as well as the critical load path. A voltage-tapped terminal—like the terminal 178—on the interconnect PCB 142 may offer a connection terminal that would take voltage through one of these two paths and allow interconnecting that to the main PCB voltage terminal 110 (FIG. 8). The CTs on L1—that is, the CT 168 (main path) and the CT 192 (critical loads path)—may be wired to the appropriate terminals of the ACT connector 111 (FIG. 8) on the main PCB 102. For example, in one embodiment, the CT leads 169 may connect to the ACT1 input whereas the CT leads 193 may connect to the ACT2 input. Similarly, the CTs on L2—that is, the CT 189 (main path) and the CT 195 (critical loads path)—may be wired to the appropriate terminals of the BCT connector 112 (FIG. 8) on the main PCB 102. For example, in one embodiment, the CT leads 190 may connect to the BCT1 input whereas the CT leads 196 may connect to the BCT2 input.

It is observed here that, depending on the use case, the voltage connectors on the intermediate PCB may include and L3 input in addition to the L1, L2, and N inputs. On the other hand, some versions of the electrical unit 95 may not include the interconnect hardware—such as an interconnect PCB and related wiring—within the enclosure 97. In that case, an installer (such as, for example, a qualified electrician) may use the electrical unit 95 with CTs and voltage taps external to the device enclosure, and hook these external units back to the main PCB 102 in the device 95. For example, a 3-phase metering application may result in too many conductors through the enclosure 97 and, hence, the electrical unit 95 designed for such an application may ship without such conductors and other interconnect hardware. As another example, in case of a system with current rated higher than the interconnect design could handle, the device 95 may ship without any interconnect parts, allowing the installer/electrician to use external CTs.

In some embodiments, instead of an interconnect PCB, one or more terminal blocks (not shown) may be mounted within the enclosure 97 either directly or on a DIN rail. Like an interconnect PCB, a terminal block may provide electrical connections to/from the electrical points external to the enclosure 97. The main PCB may be appropriately wired to the terminal block(s). In the embodiments with terminal blocks, the current transformers (CTs) may sit on the wiring behind the terminal block to complete the circuit. As a result, an installer (such as an electrician) may not have to take care of getting a CT over the conductor he/she is wiring up. Furthermore, in certain embodiments, a layered arrangement of interface and operative modules may be devised. For example, a clear acrylic sheet (not shown) may be used as protection and as a partition that separates the components of the interface module and those of the operating module in an electrical unit, such as the unit 10 in FIG. 1. In that case, instead of having a separate user-accessible area (such as in case of the embodiments in FIGS. 2-5 and 7), all of the area above the acrylic sheet may be considered safe for a low expertise technician/user, and the area below the acrylic sheet may be for the electrician/high expertise installer only. All low voltage wiring may be brought out over the acrylic sheet through an opening in the top of the sheet—such as, for example, an opening in the top right corner of the acrylic sheet. The clear acrylic sheet may allow visibility of status LEDs on the main PCB below, and may also contain holes in it for access to the switches on the main PCB. The acrylic sheet-based configuration may be implemented with the above-mentioned terminal blocks or with an interconnect PCB. Similarly, terminal blocks may be implemented in the earlier-described embodiments (such as, for example, the embodiments of FIGS. 2-3, 7) in place of an interconnect PCB.

In the preceding description, for purposes of explanation and not limitation, specific details are set forth (such as particular architectures, interfaces, techniques, etc.) in order to provide a thorough understanding of the disclosed technology. However, it will be apparent to those skilled in the art that the disclosed technology may be practiced in other embodiments that depart from these specific details. That is, those skilled in the art will be able to devise various arrangements which, although not explicitly described or shown herein, embody the principles of the disclosed technology. In some instances, detailed descriptions of well-known devices, circuits, and methods are omitted so as not to obscure the description of the disclosed technology with unnecessary detail. All statements herein reciting principles, aspects, and embodiments of the disclosed technology, as well as specific examples thereof, are intended to encompass both structural and functional equivalents thereof. Additionally, it is intended that such equivalents include both currently known equivalents as well as equivalents developed in the future, such as, for example, any monitoring devices developed that perform the same function, regardless of structure.

It will be appreciated by those skilled in the art that block diagrams herein (e.g., in FIGS. 1-5 and 7-9) represent conceptual views of illustrative circuitry or other functional units embodying the principles of the technology. Similarly, it will be appreciated that the flowchart in FIG. 6 represents exemplary method steps embodying the principles of the present disclosure.

Alternative embodiments of an electrical unit—such as any of the electrical units shown in FIGS. 1-5 and 7 (with details in FIGS. 8-9)—according to inventive aspects of the present disclosure may include additional components responsible for providing additional functionality, including any of the functionality identified above and/or any functionality necessary to support the solution as per the teachings of the present disclosure. Although features and elements are described above in particular combinations, each feature or element can be used alone without the other features and elements or in various combinations with or without other features.

The foregoing describes an electrical unit that has a modular hardware structure in which more complex and unsafe portions of the device are restricted for access by a qualified electrician only, whereas safe areas are made accessible to a non-electrician user (such as a homeowner or a low expertise technician) to help diagnose issues and/or upgrade the functionality of the device without requiring the presence of a high expertise technician/electrician. Such divided access-based electrical unit may be used to monitor and report the generation and consumption of renewable energy. Thus, the electrical unit has two features—modular upgradeability, and separate access levels (or protection domains). As part of modular upgradeability, the unit may include the ability to add new communication interfaces in a modular manner. Thus, instead of replacing the entire monitoring unit, new communication interfaces can simply be added or replaced, preferably by a non-electrician user. Protection domains are created by designing the electrical unit to include an easier level of physical access, open to the homeowner or a low expertise technician. This area would support the modular upgrade interfaces for communication as well as diagnostic interfaces for troubleshooting. A more tightly restricted area of access may be used to shield the high voltage wiring as well as wired industrial communication interfaces from the homeowner. Multiple device configurations may be supported depending on what components are populated within the main PCB in the controlled portion (the restricted access area) of the device. A smaller, interconnect PCB also may be provided in the protected portion and may be hardware-paired with the main PCB to facilitate wiring of the main PCB via the interconnect PCB and add further modularity to the electrical interconnect scheme for the device.

As will be recognized by those skilled in the art, the innovative concepts described in the present application can be modified and varied over a wide range of applications. Accordingly, the scope of patented subject matter should not be limited to any of the specific exemplary teachings discussed above, but is instead defined by the following claims.

What is claimed is:

1. An electrical unit comprising:
   an operative module having circuit components accessible to a qualified electrician only, wherein the operative module includes:
      a main Printed Circuit Board (PCB) selectively populated with a first portion of the circuit components and having electrical connections that enable the electrical unit to be operated in at least one of a plurality of configurations depending on which components are in the first portion of the circuit components populating the main PCB; and
      an interconnect PCB that is hardware-paired with the main PCB, wherein the interconnect PCB is smaller in size than the main PCB and is selectively populated with a second portion of the circuit components, wherein circuit components in the second portion are based on and hardware-paired with the circuit components in the first portion so as to facilitate wiring of the main PCB via the interconnect PCB to enable the electrical unit to be operated in the at least one of the plurality of configurations; and
   an interface module physically attached to the operative module and electrically connected thereto to form a unitary structure for the electrical unit, wherein the interface module includes at least one of the following:
      a communication interface to enable the operative module to remotely communicate with a control unit external to the electrical unit, and
      a diagnostic interface to indicate operational status of the electrical unit and to enable remote diagnosis of the electrical unit,
      wherein the interface module is accessible to a non-electrician user to perform upgrade of the interface module and troubleshooting for the electrical unit without requiring presence of a qualified electrician.

2. The electrical unit of claim 1, wherein the first portion of the circuit components includes the following:
   a first energy-metering chip;
   a voltage connector, wherein the voltage connector includes one or more of the following:
      a first line (L1) terminal,
      a second line (L2) terminal,
      a third line (L3) terminal, and
      a neutral (N) terminal; and
   a first current transformer (ACT) connector, wherein the first current transformer connector includes one or more of the following:
      an ACT-specific first input (ACT1) terminal,
      an ACT-specific second input (ACT2) terminal, and
      an ACT-specific third input (ACT3) terminal.

3. The electrical unit of claim 2, wherein the plurality of configurations includes:
   a single-phase renewable energy generation monitoring unit;
   a single-phase renewable energy generation monitoring unit with single-phase home energy consumption metering; and
   a three-phase renewable energy generation monitoring unit.

4. The electrical unit of claim 2, wherein the first portion of the circuit components further includes the following:
   a second energy-metering chip; and
   a second current transformer (BCT) connector, wherein the second current transformer connector includes one or more of the following:
      a BCT-specific first input (BCT1) terminal,
      a BCT-specific second input (BCT2) terminal, and
      a BCT-specific third input (BCT3) terminal.

5. The electrical unit of claim 4, wherein the plurality of configurations includes:
   a three-phase renewable energy monitoring unit with three-phase home energy consumption metering; and
   a single-phase renewable energy generation and storage monitoring unit with critical loads.

6. The electrical unit of claim 1, wherein the first portion of the circuit components includes at least one of the following:
   an RS-485 port;
   a memory unit;
   a Wireless Fidelity (Wi-Fi) port;
   an Ethernet port;
   a Universal Serial Bus (USB) port;
   an electrical relay unit; and
   hardware and software to support wireless cellular communication.

7. The electrical unit of claim 1, wherein the interconnect PCB includes at least one pair of voltage connectors, wherein a first voltage connector in the pair of voltage connectors is configured to receive one or more input voltage-carrying wires from a first external device, wherein a second voltage connector in the pair of voltage connectors is configured to receive one or more output voltage-carrying wires to be further connected to a second external device, and wherein each of the first and the second voltage connectors includes one or more of the following:

a first line (L1) terminal,
a second line (L2) terminal,
a third line (L3) terminal, and
a neutral (N) terminal.

8. The electrical unit of claim 7, wherein the interconnect PCB further includes at least one electrical relay unit.

9. The electrical unit of claim 1, further comprising:
an inner cover that shields the operative module to prevent the non-electrician user from accessing the operative module; and
a removable outer cover that is placed over the inner cover to allow the non-electrician user to access the interface module.

10. The electrical unit of claim 1, further comprising:
a first cover that shields the operative module to prevent the non-electrician user from accessing the operative module; and
a removable second cover that is placed adjacent to the first cover and over the interface module to allow the non-electrician user to access the interface module.

11. The electrical unit of claim 1, wherein the electrical unit is one of the following:
a renewable energy monitoring unit;
an electrical switch;
a circuit load panel;
an energy storage meter; and
an electrical energy monitoring unit.

12. The electrical unit of claim 1, wherein the operative module further includes:
a terminal block to facilitate wiring of the main PCB via the terminal block to enable the electrical unit to be operated in the at least one of the plurality of configurations.

13. The electrical unit of claim 1, further comprising:
an acrylic sheet physically separating the interface module and operative module, wherein the interface module is above the acrylic sheet and is accessible to the non-electrician user when the electrical unit is opened, and wherein the operative module is below the acrylic sheet when the electrical unit is opened to prevent the non-electrician user from accessing the operative module.

14. A method comprising:
providing an electrical unit that includes:
an operative module having circuit components accessible to a qualified electrician only, wherein the operative module includes:
a main Printed Circuit Board (PCB) selectively populated with a first portion of the circuit components and having electrical connections that enable the electrical unit to be operated in at least one of a plurality of configurations depending on which components are in the first portion of the circuit components populating the main PCB, and
an interconnect PCB that is hardware-paired with the main PCB, wherein the interconnect PCB is smaller in size than the main PCB and is selectively populated with a second portion of the circuit components, wherein circuit components in the second portion are based on and hardware-paired with the circuit components in the first portion so as to facilitate wiring of the main PCB via the interconnect PCB to enable the electrical unit to be operated in the at least one of the plurality of configurations; and
an interface module physically attached to the operative module and electrically connected thereto to form a unitary structure for the electrical unit, wherein the interface module includes at least one of the following:
a communication interface to enable the operative module to remotely communicate with a control unit external to the electrical unit, and
a diagnostic interface to indicate operational status of the electrical unit and to enable remote diagnosis of the electrical unit,
wherein the interface module is accessible to a non-electrician user without requiring presence of a qualified electrician; and
remotely instructing the non-electrician user to perform upgrade of the interface module and troubleshooting for the electrical unit using the interface module.

15. An electrical unit comprising:
an operative module having circuit components accessible to a qualified electrician only, wherein the operative module includes:
a main Printed Circuit Board (PCB) selectively populated with a first portion of the circuit components and having electrical connections that enable the electrical unit to be operated in at least one of a plurality of configurations depending on which components are in the first portion of the circuit components populating the main PCB; and
an interconnect PCB that is hardware-paired with the main PCB, wherein the interconnect PCB is smaller in size than the main PCB and is selectively populated with a second portion of the circuit components, wherein circuit components in the second portion are based on and hardware-paired with the circuit components in the first portion so as to facilitate wiring of the main PCB via the interconnect PCB to enable the electrical unit to be operated in the at least one of the plurality of configurations; and
an interface module physically attachable to the operative module and electrically connectible thereto, wherein, upon attachment, the operative module and the interface module form a unitary structure for the electrical unit, wherein the interface module includes at least one of the following:
a communication interface to enable the operative module to remotely communicate with a control unit external to the electrical unit, and
a diagnostic interface to indicate operational status of the electrical unit and to enable remote diagnosis of the electrical unit,
wherein the interface module is accessible to a non-electrician user to perform upgrade of the interface module and troubleshooting for the electrical unit without requiring presence of a qualified electrician.

16. The electrical unit of claim 15, wherein, upon attachment, the operative module and the interface module are covered in a nested configuration in which an inner cover shields the operative module to prevent the non-electrician user from accessing the operative module and a removable outer cover is placed over the inner cover to allow the non-electrician user to access the interface module.

17. The electrical unit of claim 15, wherein, upon attachment, the operative module and the interface module are covered in a non-overlapping configuration in which a first cover shields the operative module to prevent the non-electrician user from accessing the operative module and a removable second cover is placed adjacent to the first cover and over the interface module to allow the non-electrician user to access the interface module.

18. The electrical unit of claim 15, further comprising an acrylic sheet to physically separate the interface module and operative module, wherein, upon attachment the interface module is above the acrylic sheet and is accessible to the non-electrician user when the electrical unit is opened, and wherein the operative module is below the acrylic sheet when the electrical unit is opened to prevent the non-electrician user from accessing the operative module.

19. The electrical unit of claim 15, wherein the first portion of the circuit components includes at least one of the following:
   a first energy-metering chip;
   a voltage connector that includes one or more of the following:
      a first line (L1) terminal,
      a second line (L2) terminal,
      a third line (L3) terminal, and
      a neutral (N) terminal; and
   a first current transformer (ACT) connector which includes one or more of the following:
      an ACT-specific first input (ACT1) terminal,
      an ACT-specific second input (ACT2) terminal, and
      an ACT-specific third input (ACT3) terminal.

20. The electrical unit of claim 19, wherein the plurality of configurations includes:
   a single-phase renewable energy generation monitoring unit;
   a single-phase renewable energy generation monitoring unit with single-phase home energy consumption metering; and
   a three-phase renewable energy generation monitoring unit.

* * * * *